US006570325B2

(12) United States Patent
Graff et al.

(10) Patent No.: US 6,570,325 B2
(45) Date of Patent: May 27, 2003

(54) ENVIRONMENTAL BARRIER MATERIAL FOR ORGANIC LIGHT EMITTING DEVICE AND METHOD OF MAKING

(75) Inventors: Gordon L. Graff, West Richland, WA (US); Mark E. Gross, Pasco, WA (US); John D. Affinito, Tucson, AZ (US); Ming-Kun Shi, Richland, WA (US); Michael G. Hall, West Richland, WA (US); Eric S. Mast, Richland, WA (US); Robert Walty, Encinitas, CA (US); Nicole Rutherford, Saratoga, CA (US); Paul E. Burrows, Kennewick, WA (US); Peter M. Martin, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 09/887,605

(22) Filed: Jun. 22, 2001

(65) Prior Publication Data

US 2002/0125822 A1 Sep. 12, 2002

Related U.S. Application Data

(63) Continuation-in-part of application No. 09/427,138, filed on Oct. 25, 1999, which is a continuation-in-part of application No. 09/212,779, filed on Dec. 16, 1998, now Pat. No. 6,268,695.

(51) Int. Cl.[7] .................................................. H01J 1/62
(52) U.S. Cl. ....................... 313/506; 313/502; 313/503; 313/504
(58) Field of Search ................................ 313/506, 504, 313/503, 502; 428/690, 917

(56) References Cited

U.S. PATENT DOCUMENTS

| 3,475,307 A | 10/1969 | Knox et al. |
| 3,607,365 A | 9/1971 | Lindlof |
| 4,283,482 A | 8/1981 | Hattori et al. |

(List continued on next page.)

FOREIGN PATENT DOCUMENTS

| BE | 704 297 | 2/1968 |
| DE | 19603746 | 4/1997 |
| EP | 0 340 935 | 11/1989 |

(List continued on next page.)

OTHER PUBLICATIONS

Gustafson et al., Nature, vol. 357, Jun. 11, 1992, pp. 447–479.
Affinito, J.D. et al., Polymer–Oxide Transparent Barrier Layers Produced Using the PML Process, 39th Annual Technical Conference Proceedings of the Society of Vacuum Coaters, Vacuum Web Coating Session, 1996, pp. 392–397.

(List continued on next page.)

Primary Examiner—Vip Patel
Assistant Examiner—Ken A Berck
(74) Attorney, Agent, or Firm—Killworth, Gottman, Hagan & Schaeff, L.L.P.

(57) ABSTRACT

An encapsulated organic light emitting device. The device may include a substrate, an organic light emitting layer stack adjacent to the substrate, and at least one first barrier stack adjacent to the organic light emitting device, the at least one first barrier stack comprising at least one first barrier layer and at least one first decoupling layer wherein the at least one first barrier stack encapsulates the organic light emitting device. There may be a second barrier stack adjacent to the substrate and located between the substrate and the organic light emitting device. The second barrier stack has at least one second barrier layer and at least one second decoupling layer. A method of making the encapsulated organic light emitting device is also provided.

44 Claims, 2 Drawing Sheets

U.S. PATENT DOCUMENTS

| | | | |
|---|---|---|---|
| 4,581,337 A | 4/1986 | Frey et al. |
| 4,842,893 A | 6/1989 | Yializis et al. |
| 4,954,371 A | 9/1990 | Yializis |
| 5,032,461 A | 7/1991 | Shaw et al. |
| 5,036,249 A | 7/1991 | Pike-Biegunski et al. |
| 5,124,204 A | 6/1992 | Yamashita et al. |
| 5,189,405 A | 2/1993 | Yamashita et al. |
| 5,237,439 A | 8/1993 | Misono et al. |
| 5,260,095 A | 11/1993 | Affinito |
| 5,354,497 A | 10/1994 | Fukuchi et al. |
| 5,395,644 A | 3/1995 | Affinito |
| 5,427,638 A | 6/1995 | Goetz et al. |
| 5,440,446 A | 8/1995 | Shaw et al. |
| 5,536,323 A | 7/1996 | Kirlin et al. |
| 5,547,508 A | 8/1996 | Affinito |
| 5,554,220 A | 9/1996 | Forrest et al. |
| 5,576,101 A | 11/1996 | Saitoh et al. |
| 5,607,789 A | 3/1997 | Treger et al. |
| 5,620,524 A | 4/1997 | Fan et al. |
| 5,629,389 A | 5/1997 | Roitman et al. |
| 5,654,084 A | 8/1997 | Egert |
| 5,681,615 A | 10/1997 | Affinito et al. |
| 5,681,666 A | 10/1997 | Treger et al. |
| 5,684,084 A | 11/1997 | Lewin et al. |
| 5,686,360 A | 11/1997 | Harvey, III et al. |
| 5,693,956 A | 12/1997 | Shi et al. |
| 5,711,816 A | 1/1998 | Kirlin et al. |
| 5,725,909 A | 3/1998 | Shaw et al. |
| 5,731,661 A | 3/1998 | So et al. |
| 5,747,182 A | 5/1998 | Friend et al. |
| 5,757,126 A | 5/1998 | Harvey, III et al. |
| 5,759,329 A | 6/1998 | Krause et al. |
| 5,771,562 A | 6/1998 | Harvey, III et al. |
| 5,792,550 A | 8/1998 | Phillips et al. |
| 5,811,177 A | 9/1998 | Shi et al. |
| 5,811,183 A | 9/1998 | Shaw et al. |
| 5,821,692 A | 10/1998 | Rogers et al. |
| 5,844,363 A | 12/1998 | Gu et al. |
| 5,872,355 A | 2/1999 | Hueschen |
| 5,902,641 A | 5/1999 | Affinito et al. |
| 5,902,688 A | 5/1999 | Antoniadis et al. |
| 5,912,069 A | 6/1999 | Yializis et al. |
| 5,922,161 A | 7/1999 | Wu et al. |
| 5,945,174 A | 8/1999 | Shaw et al. |
| 5,948,552 A | 9/1999 | Antoniadis et al. |
| 5,952,778 A | 9/1999 | Haskal et al. |
| 5,965,907 A | 10/1999 | Huang et al. |
| 5,996,498 A | 12/1999 | Lewis |
| 6,040,017 A | 3/2000 | Makhael et al. |
| 6,066,826 A | 5/2000 | Yializis |
| 6,083,628 A | 7/2000 | Yializis |
| 6,092,269 A | 7/2000 | Yializis et al. |
| 6,106,627 A | 8/2000 | Yializis |
| 6,118,218 A | 9/2000 | Yializis et al. |
| 6,146,225 A | 11/2000 | Sheats et al. |
| 6,146,462 A | 11/2000 | Yializis et al. |
| 6,198,217 B1 | 3/2001 | Suzuki et al. |
| 6,198,220 B1 | 3/2001 | Jones et al. |
| 6,214,422 B1 | 4/2001 | Yializis |
| 6,231,939 B1 | 5/2001 | Shaw et al. |

FOREIGN PATENT DOCUMENTS

| | | |
|---|---|---|
| EP | 0 299 753 | 2/1993 |
| EP | 0 547 550 | 6/1993 |
| EP | 0 590 467 | 4/1994 |
| EP | 0 390 540 | 8/1994 |
| EP | 0 722 787 | 7/1996 |
| EP | 0 787 826 | 8/1997 |
| EP | 0 916 394 | 5/1999 |
| EP | 0 931 850 | 7/1999 |
| EP | 0 977 469 | 2/2000 |
| JP | 63136316 | 6/1988 |
| JP | 64-18441 | 1/1989 |
| JP | 2-183230 | 7/1990 |
| JP | 08325713 | 12/1996 |
| JP | 09059763 | 3/1997 |
| WO | WO 87 07848 | 12/1987 |
| WO | WO 95 10117 | 4/1995 |
| WO | WO 97 04885 | 2/1997 |
| WO | WO 97 22631 | 6/1997 |
| WO | WO 98 10116 | 3/1998 |
| WO | WO 98 18852 | 5/1998 |
| WO | WO 99 16557 | 4/1999 |
| WO | WO 99 16931 | 4/1999 |

OTHER PUBLICATIONS

Affinito, J.D. et al., PML/Oxide/PML Barrier Layer Performance Diffferences Arising From Use of UV or Electron Beam Polymerization of the PML Layers, Thin Solid Films, 1997, vol. 308, pp. 19–25.

Affinito, J.D. et al., "Vacuum Deposition of Polymer Electrolytes On Flexibe Substrates", "Proceedings of the Ninth International Conference on Vacuum Web Coating", Nov. 1995 ed., R. Bakish Press 1995, pp. 20–36.

Vossen, J.L. et al., Thin Film Processes, Academic Press, 1978, Part II, Chapter II–I, Glow Discharge Sputter Deposition, pp. 12–63; Part IV, Chapter IV–1 Plasms Deposition of Inorganic Compounds and Chapter IV–2 Glow Discharge Polymerization, pp. 335–397.

Penning, F.M. et al., Electrical Discharges in Gasses, Gordon and Breach Science Publishers, 1965, Chapters 5–6, pp. 19–35, and Chapter 8, pp. 41–50.

Affinito, J.D. et al., "High Rate Vacuum Deposition of Polymer Electrolytes", Journal Vacuum Science Technology A 14(3), May/Jun. 1996.

Inoue et al., Proc. Jpn. Congr. Mater. Res., vol. 33, 1990. pp. 177–179.

Affinito, J.D. et al., Ultra High Rate, Wide Area, Plasma Polymerized Films from High Molecular Weight/Low Vapor Pressure Liquid or Solid Monomer Precursors, Journal Vacuum Science Technology A 17(4), Jul./Aug. 1999, pp. 1974–1981.

Affinito, J.D. et al., Polymer/Polymer, Polymer/Oxide, and Polymer/metal Vacuum Deposited Interference Filters, Tenth International Vacuum Web Coating Conference, Nov. 1996, pp. 1–14.

Affinito, J.D. et al., Ultra High Rate, Wide Area, Plasma Polymerized Films from High Molecular Weight/Low Vapor Pressure Liquid or Solid Monomer Precursors, 45th International Symposium of the American Vacuum Society, pp. 1–26.

Affinito, J.D. et al., Vacuum Deposited Conductive Polymer Films, The Eleventh International Conference on Vacuum Web Coating, pp. 1–12.

Shi, M.K. et al., In–situ and real–time minitoring of plasma–induced etching of PET and acrylic films, pp. 1–25.

Shi, M.K. et al., Plasma treatment of PET and acrylic coating surfaces: I. In–situ XPS measurements, pp. 1–28.

Affinito, J.D. et al., Vacuum deposited polymer/metal multilayer films for optical application, Thin Solid Films 270, 1995, pp. 43–48.

Affinito, J.D. et al., Molecularly Doped Polymer Composite Films for Light Emitting Polymer Applications Fabricated by the PML Process, 41st Technical Conference of the Society of Vacuum Coaters, Apr. 1998, pp. 1–6.

Affinito, J.D. et al., A new method for fabricating transparent barrier layers, Thin Solid Films 290–291, 1996, pp. 63–67.

Affinito, J.D. et al., Vacuum deposited polymer/metal films for optical applicatons, pp. 1–14.

Affinito, J.D. et al., Vacuum Deposition of Polymer Electrolytes On Flexible Substrates, The Ninth International Conference on Vacuum Web Coating, pp. 1–16.

Shaw, D.G. et al., Use of Vapor Deposited Acrylate Coatings to Improve the Barrier Properties of Metallized Film, Society of Vacuum Coaters, 37th Annual Technical Conference Proceedings, 1994, pp. 240–244.

Chahroudi, D., Transparent Glass Barrier Coatings for Flexible Film Packaging, Society of Vacuum Coaters, 34th Annual Technical Conference Proceedings, 1991, pp. 130–133.

Tropsha, Y.G. et al., Activated Rate Theory Treatment of Oxygen and Water Transport through Silicon Oxide/Poly(ethylene terephthalate) Composite Barrier Structures, J. Phys. Chem. B, vol. 101, No. 13, 1997, pp. 2259–2266.

Tropsha, Y.G. et al., Combinatorial Barrier Effect of the Multilayer SiOx Coatings on Polymer Substrates, Society of Vacuum Coaters, 40th Annual Technical Conference Proceedings, 1997, pp. 64–69.

ENVIRONMENTAL BARRIER MATERIAL FOR ORGANIC LIGHT EMITTING DEVICE AND METHOD OF MAKING

BACKGROUND OF THE INVENTION

This application is a continuation-in-part of U.S. patent application Ser. No. 09/427,138, filed Oct. 25, 1999 entitled "Environmental Barrier Material for Organic Light Emitting Device and Method of Making" which is a continuation-in-part of U.S. patent application Ser. No. 09/212,779, filed Dec. 16, 1998, now U.S. Pat. No. 6,268,695 entitled "Environmental Barrier Material for Organic Light Emitting Device and Method of Making."

The present invention relates to organic light emitting devices (OLEDs), and more particularly to OLEDs encapsulated in barrier stacks.

There is a need for versatile visual displays for electronic products of many different types. Light emitting diodes (LEDs) and liquid crystal displays (LCDs) have found many useful applications, but they are not adequate for all situations. OLEDs are a relatively new type of visual display which has shown great promise. An OLED basically includes an organic electroluminescent substance placed between two electrodes. When an electric potential is applied across the electrodes, the electroluminescent substance emits visible light. Typically, one of the electrodes is transparent, allowing the light to shine through. U.S. Pat. Nos. 5,629,389 (Roitman et al.), 5,747,182 (Friend et al.), 5,844,363 (Gu et al.), 5,872,355 (Hueschen), 5,902,688 (Antoniadis et al.), and 5,948,552 (Antoniadis et al.), which are incorporated herein by reference, disclose various OLED structures.

The use of OLEDs in flat panel displays and other information display formats is limited by the poor environmental stability of the devices. G. Gustafson, Y. Cao, G. M. Treacy, F. Klavetter, N. Colaneri, and A. J. Heeger, Nature, Vol. 35, Jun. 11, 1992, pages 477–479. Humidity and oxygen significantly reduce the useful life of most OLEDs. As a result, these devices are typically fabricated on glass substrates with glass covers laminated on top of the OLED and with the edges sealed to exclude water and oxygen from the active layers. U.S. Pat. No. 5,872,355 discloses the use of a polymer such as saran to seal the device. The water vapor permeation rates (WVTR) required to provide sufficient lifetime for OLEDs is calculated to be approximately $10^{-6}$ g/m$^2$/day. The best polymer films (such as saran) have WVTR values that are 5 orders of magnitude too high to be considered for OLED encapsulation. Furthermore, saran cannot be deposited using flash evaporation, condensation, and in situ polymerization within a vacuum chamber.

Thus, there is a need for an improved lightweight, barrier construction which can be used to encapsulate the OLED and prevent the deterioration caused by permeation of oxygen and water vapor and for a method of making such an encapsulated OLED.

SUMMARY OF THE INVENTION

These needs are met by the present invention which is an encapsulated organic light emitting device (OLED). In one embodiment, the encapsulated OLED includes a substrate, an organic light emitting device adjacent to the substrate, and at least one first barrier stack adjacent to the organic light emitting device, the at least one first barrier stack comprising at least one first barrier layer and at least one first decoupling layer, wherein the at least one first barrier stack encapsulates the organic light emitting device. By 'adjacent,' we mean next to, but not necessarily directly next to. There can be additional layers intervening between the adjacent layers.

Optionally, there can be at least one second barrier stack adjacent to the organic light emitting layer device and located between the substrate and the organic light emitting device. The second barrier stack has at least one second barrier layer and at least one second decoupling layer. The first barrier stack can be substantially transparent, the second barrier stack can be substantially transparent, or both the first and second barrier stacks can be substantially transparent, depending upon the particular application. At least one of the first or second barrier layers may be made from a material including, but not limited to, metals, metal oxides, metal nitrides, metal carbides, metal oxynitrides, metal oxyborides, and combinations thereof. Metals include, but are not limited to, aluminum, titanium, indium, tin, tantalum, zirconium, niobium, hafnium, yttrium, nickel, tungsten, chromium, zinc, alloys thereof, and combinations thereof. Metal oxides include, but are not limited to, silicon oxide, aluminum oxide, titanium oxide, indium oxide, tin oxide, indium tin oxide, tantalum oxide, zirconium oxide, niobium oxide, hafnium oxide, yttrium oxide, nickel oxide, tungsten oxide, chromium oxide, zinc oxide, and combinations thereof. Metal nitrides include, but are not limited to, aluminum nitride, silicon nitride, boron nitride, germanium nitride, chromium nitride, nickel nitride, and combinations thereof. Metal carbides include, but are not limited to, boron carbide, tungsten carbide, silicon carbide, and combinations thereof. Metal oxynitrides include, but are not limited to, aluminum oxynitride, silicon oxynitride, boron oxynitride, and combinations thereof. Metal oxyborides include, but are not limited to, zirconium oxyboride, titanium oxyboride, and combinations thereof.

Substantially opaque barrier layers can be made from opaque materials including, but not limited to, opaque metals, opaque polymers, opaque ceramics, opaque cermets, and combinations thereof. Opaque cermets include, but are not limited to, zirconium nitride, titanium nitride, hafnium nitride, tantalum nitride, niobium nitride, tungsten disilicide, titanium diboride, zirconium diboride, and combinations thereof.

The barrier layers in the first and second barrier stacks can be made of the same material or a different material. Barrier layers within the first or second barrier stacks can be the same or different.

The substrate can be either a flexible substrate or a rigid substrate. Flexible substrates include, but are not limited to, polymers, metals, paper, fabric, glass, and combinations thereof. Rigid substrates include, but are not limited to, ceramics, metals, glass, semiconductors, and combinations thereof.

The decoupling layers of the first and second barrier stacks can be made from materials including, but not limited to, organic polymers, inorganic polymers, organometallic polymers, hybrid organic/inorganic polymer systems, and silicates. Organic polymers include, but are not limited to, (meth)acrylates, urethanes, polyamides, polyimides, polybutylenes, isobutylene isoprene, polyolefins, epoxies, parylene, benzocyclobutadiene, polynorbornenes, polyarylethers, polycarbonate, alkyds, polyaniline, ethylene vinyl acetate, and ethylene acrylic acid. Inorganic polymers include, but are not limited to, silicones, polyphosphazenes, polysilazne, polycarbosilane, polycarborane, carborane siloxanes, polysilanes, phosphonitriles, sulfur nitride polymers and siloxanes. Organometallic polymers include, but are not limited to, organometallic polymers of main group metals, transition metals and lanthanide/actinide metals (for example, polymetallocenylenes such as polyferrocene and polyruthenocene). Hybrid organic/inorganic polymer systems include, but are not limited to, organically modified silicates, ceramers, preceramic polymers, polyimide-silica hybrids, (meth)acrylate-silica hybrids, polydimethylsiloxane-silica hybrids. The decoupling layers in the first and the second barrier stacks can be the same or different. Decoupling layers within the first and second barrier layers can be the same or different at 23° C. and 0% relative.

The encapsulated organic light emitting device can have an oxygen transmission rate through the at least one first barrier stack of less than 0.005 cc/m$^2$/day at 23° C. and 0% relative humidity, an oxygen transmission rate through the at least one first barrier stack of less than 0.005 cc/m$^2$/day at 38° C. and 90% relative humidity, or a water vapor transmission rate through the at least one first barrier stack of less than 0.005 gm/m$^2$/day at 38° C. and 100% relative humidity.

There can optionally be a functional layer adjacent to the substrate and located between the substrate and the organic light emitting device. There can also be a functional layer adjacent to the first barrier stack on a side opposite the organic light emitting device, if desired.

The encapsulated organic light emitting device can optionally include a protective layer adjacent to the at least one first barrier stack on the side opposite the organic light emitting device.

Another embodiment of the invention involves an encapsulated organic light emitting device including at least one second barrier stack comprising at least one second barrier layer and at least one second decoupling layer, an organic light emitting device adjacent to the at least one second barrier stack, and at least one first barrier stack adjacent to the organic light emitting device, the at least one first barrier stack comprising at least one first barrier layer and at least one first decoupling layer, wherein the at least one first barrier stack and the at least one second barrier stack encapsulate the organic light emitting device. The encapsulated OLED optionally includes a substrate adjacent to the at least one second barrier stack on the side opposite the organic light emitting device.

The invention also involves a method of making encapsulated organic light emitting devices. The method includes providing a substrate having an organic light emitting device thereon, and placing at least one first barrier stack adjacent to the organic light emitting device to encapsulate the organic light emitting device, the at least one first barrier stack comprising at least one first barrier layer and at least one first decoupling layer.

Placing the at least one first barrier stack adjacent to the organic light emitting device includes, but is not limited to, depositing the at least one first barrier stack adjacent to the organic light emitting device, and laminating the at least one first barrier stack adjacent to the organic light emitting device. Depositing the at least one first barrier stack includes, but is not limited to, depositing the at least one first barrier stack in vacuum, depositing the at least one first barrier stack at atmospheric pressure, and depositing the at least one first barrier layer in vacuum and depositing the at least one first decoupling layer at atmospheric pressure. Methods of laminating the at least one first barrier stack adjacent to the organic light emitting device include, but are not limited to, laminating by heating, soldering, ultrasonic welding, applying pressure, and using an adhesive.

Providing the substrate having the organic light emitting device thereon includes, but is not limited to, providing the substrate, and placing the organic light emitting device adjacent to the substrate. Placing the organic light emitting device adjacent to the substrate includes, but is not limited to, depositing the organic light emitting device adjacent to the substrate, and laminating the organic light emitting device adjacent to the substrate. Depositing the organic light emitting device includes, but is not limited to, depositing the organic light emitting device in vacuum.

At least one second barrier stack may be placed adjacent to the substrate before the organic light emitting device is placed thereon so that the organic light emitting device is encapsulated between the at least one first and second barrier stacks, the at least one second barrier stack comprising at least one second barrier layer and at least one second decoupling layer. Placing the at least one second barrier stack adjacent to the substrate includes, but is not limited to, depositing the at least one second barrier stack adjacent to the substrate, and laminating the at least one second barrier stack adjacent to the substrate. Depositing the at least one second barrier stack includes, but is not limited to, depositing the at least one second barrier stack in vacuum, depositing the at least one second barrier stack at atmospheric pressure, and depositing the at least one second barrier layer in vacuum and depositing the at least one second decoupling layer at atmospheric pressure. Methods for laminating the at least one second barrier stack include, but are not limited to, heating, soldering, ultrasonic welding, applying pressure, or using an adhesive.

The substrate can be removed from the encapsulated organic light emitting device if desired, depending on the specific design of the encapsulated OLED and the application.

At least one of the at least one first or second barrier layers can include at least two barrier layers. The at least two barrier layers can be deposited using the same deposition source, or different deposition sources. They can be made of the same barrier material, or different barrier materials. They can be vacuum deposited.

Accordingly, it is an object of the present invention to provide an encapsulated OLED, and to provide a method of making such a device.

DESCRIPTION OF THE INVENTION

Figure 1:
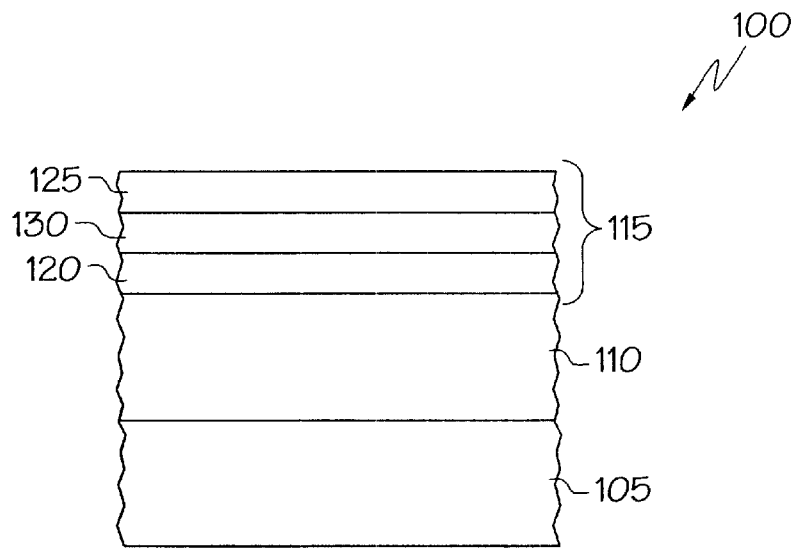
FIG. 1 is a cross-section of one embodiment of the encapsulated OLED of the present invention.

One embodiment of the present invention is shown in FIG. 1. The encapsulated OLED 100 includes a substrate 105, and organic light emitting device 110, and a first barrier stack 115. First barrier stack 115 includes first decoupling layers 120, 125 and first barrier layer 130. The organic light emitting device 110 is encapsulated between the substrate 105 and the first barrier stack 115.

Although FIG. 1 shows a barrier stack with decoupling layers on both sides of a barrier layer, the barrier stacks can have one or more decoupling layers and one or more barrier layers. There could be one decoupling layer and one barrier layer, there could be multiple decoupling layers on one side of one or more barrier layers, or there could be one or more decoupling layers on both sides of one or more barrier layers. The first layer of the barrier stack can be either the decoupling layer or the barrier layer, and the last layer can be either. The important feature is that the barrier stack have at least one decoupling layer and at least one barrier layer. The barrier layers are typically in the range of about 100–400 Å thick, and the decoupling layers are typically in the range of about 1000–10,000 Å thick, although there are no limits on thickness.

Although only one first barrier stack is shown in FIG. 1, the number of barrier stacks is not limited. The number of barrier stacks needed depends on the substrate material used and the level of permeation resistance needed for the particular application. One or two barrier stacks should provide sufficient barrier properties for some applications. The most stringent applications may require five or more barrier stacks.

The exact form and composition of the organic light emitting device 110 is not critical. It can be made using known techniques, including, but not limited to, those described in U.S. Pat. Nos. 5,629,389 (Roitman et al.), 5,844,363 (Gu et al.), 5,872,355 (Hueschen), 5,902,688 (Antoniadis et al.), and 5,948,552 (Antoniadis et al.), which have been incorporated herein by reference. The present invention is compatible with organic light emitting devices made with light emitting polymers and small molecules.

Figure 2:
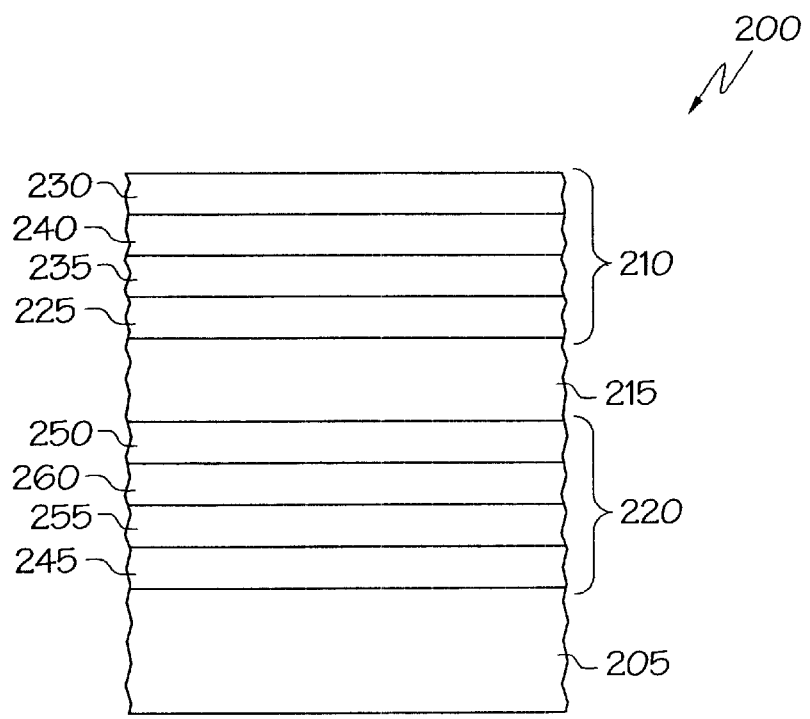
FIG. 2 is a cross-section of an alternate embodiment of the encapsulated OLED of the present invention.

Another embodiment of the present invention is the encapsulated OLED 200 as shown in FIG. 2. The encapsulated OLED 200 includes substrate 205, a first barrier stack 210, an organic light emitting device 215, and a second barrier stack 220. The first barrier stack 210 has first decoupling layers 225, 230 and first barrier layers 235, 240. The second barrier stack 220 includes second decoupling layers 245, 250 and second barrier layers 255, 260. The organic light emitting device 215 is encapsulated between first barrier stack 210 and second barrier stack 220.

Figure 3:
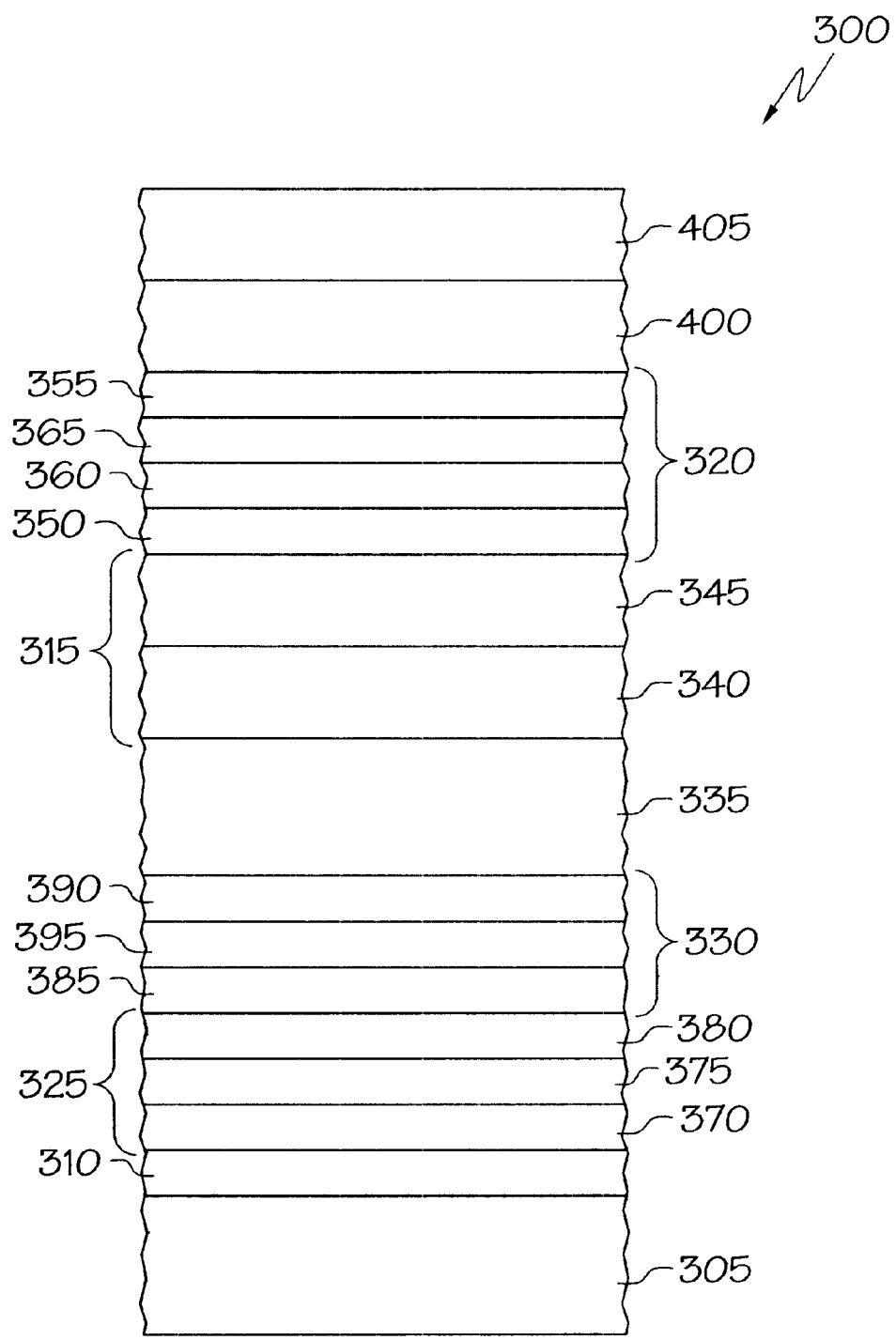
FIG. 3 is a cross-section of an alternate embodiment of the encapsulated OLED of the present invention.

In the embodiment shown in FIG. 3, the encapsulated OLED 300 includes two first barrier stacks 315, 320 and two second barrier stacks 325, 330 encapsulating the organic light emitting device 335. The encapsulated OLED 300 includes a substrate 305. There is a functional layer 310 adjacent to the substrate. Functional layers include, but are not limited to, organic or inorganic layers, planarizing layers, scratch resistant layers, anti-reflective coatings, anti-fingerprint coatings, anti-static coatings, electrically conductive layers, electrode layers, and combinations thereof. In this way, the substrate can be specifically tailored to different applications. For example, a planarizing layer could be included to reduce defects in the substrate. Such a planarizing layer could be made of materials including but not limited to, (meth)acrylates, carboxy terminated acrylonitrile-butadienes, elastomers and elastomer-modified resins, phenolics (including nitrile-phenolics), epoxies (including nitrile-epoxies and nylon-epoxies), and combinations thereof. In addition to planarizing the surface, some of these materials will improve the adhesion of the organic light emitting device and/or the barrier stacks to the substrate.

There are two first barrier stacks 315, 320. First barrier stack 315 includes first decoupling layer 340 and first barrier layer 345. First barrier stack 320 includes first decoupling layers 350, 355 and first barrier layers 360, 365. Second barrier stack 325 includes second decoupling layer 370 and second barrier layers 375, 380. Second barrier stack 330 includes second decoupling layers 385, 390 and second barrier layer 395. As discussed above, the exact number and arrangement of the barrier layers and decoupling layers in the barrier stacks is not important as long as there is at least one of each.

The substrate can be flexible or rigid, depending on the application. The flexible substrate may be any flexible material, including, but not limited to, polymers, for example polyethlyene terephthalate (PET), polyethylene naphthalate (PEN), or high temperature polymers such as polyether sulfone (PES), polyimides, or Transphan™ (a high Tg cyclic olefin polymer available from Lofo High Tech Film, GMBH of Weil am Rhein, Germany), metal, paper, fabric, flexible glass (available from Corning Inc. under the glass code 0211) and combinations thereof. The flexible glass is a glass sheet with a thickness of less than 0.6 mm that will bend at a radium of about 8 inches. Rigid substrates include, but are not limited to, ceramics, polymers, metals, glass, semiconductors, and combinations thereof. The substrate may be removed prior to use if desired, depending on the design of the encapsulated OLED and the specific application.

The barrier layers in the barrier stacks may be any suitable barrier material. The barrier layers in the first and second barrier stacks can be made of the same material or a different material. Barrier layers within the first or second barrier stacks can be the same or different. Suitable barrier materials include, but are not limited to, metals, metal oxides, metal nitrides, metal carbides, metal oxynitrides, metal oxyborides, and combinations thereof. Metals include, but are not limited to, aluminum, titanium, indium, tin, tantalum, zirconium, niobium, hafnium, yttrium, nickel, tungsten, chromium, zinc, alloys thereof, and combinations thereof. Metal oxides include, but are not limited to, silicon oxide, aluminum oxide, titanium oxide, indium oxide, tin oxide, indium tin oxide, tantalum oxide, zirconium oxide, niobium oxide, hafnium oxide, yttrium oxide, nickel oxide, tungsten oxide, chromium oxide, zinc oxide, and combinations thereof. Metal nitrides include, but are not limited to, aluminum nitride, silicon nitride, boron nitride, germanium nitride, chromium nitride, nickel nitride, and combinations thereof. Metal carbides include, but are not limited to, boron carbide, tungsten carbide, silicon carbide, and combinations thereof. Metal oxynitrides include, but are not limited to, aluminum oxynitride, silicon oxynitride, boron oxynitride, and combinations thereof. Metal oxyborides include, but are not limited to, zirconium oxyboride, titanium oxyboride, and combinations thereof. Substantially opaque barrier layers can be made from opaque materials including, but not limited to, opaque metals, opaque polymers, opaque ceramics, opaque cermets, and combinations thereof. Opaque cermets include, but are not limited to, zirconium nitride, titanium nitride, hafnium nitride, tantalum nitride, niobium nitride, tungsten disilicide, titanium diboride, zirconium diboride, and combinations thereof.

The barrier layers may be deposited by any suitable process including, but not limited to, conventional vacuum processes such as sputtering, evaporation, sublimation, chemical vapor deposition (CVD), plasma enhanced chemical vapor deposition (PECVD), electron cyclotron resonance-plasma enhanced vapor deposition (ECR-PECVD), and combinations thereof.

Some applications may require only one side of the device to be substantially transparent, and others may require both sides to be substantially transparent. If one side of the device is not required to be substantially transparent, then the barrier layers on that side could be made of a substantially opaque barrier material such as those described above. By 'substantially transparent,' we mean that there is greater than about 40% transmission in the visible range.

When the barrier layer is made of two or more barrier layers, the two (or more) barrier layers can be made from the same barrier material or from different barrier materials. If the barrier layer is made of two barrier layers, the thickness of each barrier layer is usually about one half the thickness of a typical single barrier layer, or about 50 to 200 Å. There are no limitations on the thickness, however.

When the barrier layers are made of the same material, they can be deposited either by sequential deposition using two or more sources or by the same source using two or more passes. If two or more deposition sources are used, deposition conditions can be different for each source, leading to differences in microstructure and defect dimensions. Any type of deposition source can be used. Different types of deposition processes, such as magnetron sputtering and electron beam evaporation, can be used to deposit the two or more barrier layers.

The microstructures of the two or more barrier layers are mismatched as a result of the differing deposition sources/parameters. The barrier layers can even have different crystal structure. For example, $Al_2O_3$ can exist in different phases (alpha, gamma) with different crystal orientations. The mismatched microstructure can help decouple defects in the adjacent barrier layers, enhancing the tortuous path for gases and water vapor permeation.

When the barrier layers are made of different materials, two or more deposition sources are needed. This can be accomplished by a variety of techniques. For example, if the materials are deposited by sputtering, sputtering targets of different compositions could be used to obtain thin films of different compositions. Alternatively, two or more sputtering targets of the same composition could be used but with different reactive gases. Two or more different types of deposition sources could also be used. In this arrangement, the lattices of the two or more layers are even more mismatched by the different microstructures and lattice parameters of the two or more materials.

The decoupling layer decouples defects between adjacent layers and/or the substrate. The processes used to deposit the barrier layers tend to reproduce any defects in the layer they are deposited on. Therefore, defects in or on the substrate or previous layer may be replicated in the deposited barrier layer, which can seriously limit the barrier performance of the films. The decoupling layer interrupts the propagation of defects from one layer to the next. This is achieved by reducing the surface imperfections of the substrate or previous layer, so that the subsequently deposited barrier layer or other layer, such as the organic light emitting device, has fewer defects. In addition, the decoupling layers decouple defects in the barrier layers. The decoupling layer intervenes between barrier layers so that the defects in one layer are not next to the defects in the subsequent layer. This creates a tortuous path for gas diffusion, helping to improve the barrier properties. A decoupling layer which is deposited over the barrier layer may also help to protect the barrier layer from damage during processing or further handling.

The decoupling layer can be produced by a number of known processes which provide improved surface planarity, including both atmospheric processes and vacuum processes. The decoupling layer may be formed by depositing a layer of liquid and subsequently processing the layer of liquid into a solid film. Depositing the decoupling layer as a liquid allows the liquid to flow over the defects in the substrate or previous layer, filling in low areas, and covering up high points, providing a surface with significantly improved planarity. When the decoupling layer is processed into a solid film, the improved surface planarity is retained. Suitable processes for depositing a layer of liquid material and processing it into a solid film include, but are not limited to, vacuum processes such as those described in U.S. Pat. Nos. 5,260,095, 5,395,644, 5,547,508, 5,691,615, 5,902,641, 5,440,446, and 5,725,909, which are incorporated herein by reference, and atmospheric processes such as spin coating and/or spraying.

One way to make a decoupling layer involves depositing a polymer precursor, such as a (meth)acrylate containing polymer precursor, and then polymerizing it in situ to form the decoupling layer. As used herein, the term polymer precursor means a material which can be polymerized to form a polymer, including, but not limited to, monomers, oligomers, and resins. As another example of a method of making a decoupling layer, a preceramic precursor could be deposited as a liquid by spin coating and then converted to a solid layer. Full thermal conversion is possible for a film of this type directly on a glass or oxide coated substrate. Although it cannot be fully converted to a ceramic at temperatures compatible with some flexible substrates, partial conversion to a cross-lined network structure would be satisfactory. E-beam techniques could be used to crosslink and/or densify some of these types of polymers and can be combined with thermal techniques to overcome some of the substrate thermal limitations, provided the substrate can handle the e-beam exposure. Another example of making a decoupling layer involves depositing a material, such as a polymer precursor, as a liquid at a temperature above its melting point and subsequently freezing it in place.

The decoupling layer may be made of many different materials, including, but not limited to, organic polymers, inorganic polymers, organometallic polymers, hybrid organic/inorganic polymer systems, and silicates. Organic polymers include, but are not limited to, (meth)acrylates, urethanes, polyamides, polyimides, polybutylenes, isobutylene isoprene, polyolefins, epoxies, parylene, benzocyclobutadiene, polyorbornenes, polyarylethers, polycarbonate, alkyds, polyaniline, ethylene vinyl acetate, and ethylene acrylic acid. Modified versions of the various polymer types are included within the meaning of the polymer, for example, olefins include modified olefins, such as ethylene vinyl acetate. Also, as used herein, (meth) acrylates include acrylate containing polymers and methacrylate containing polymers.

Inorganic polymers include, but are not limited to, silicones, polyphosphazenes, polysilazne, polycarbosilane, polycarborane, carborane siloxanes, polysilanes, phosphonitriles, sulfur nitride polymers, and siloxanes. Organometallic polymers include, but are not limited to, organometallic polymers of main group metals, transition metals and lanthanide/actinide metals (for example, polymetallocenylenes such as polyferrocene and polyruthenocene). Hybrid organic/inorganic polymer systems include, but are not limited to, organically modified silicates, ceramers, preceramic polymers, polyimide-silica hybrids, (meth)acrylate-silica hybrids, polydimethylsiloxane-silica hybrids. Modified versions of the various materials are included within the meaning of the types of materials described, for example, silicones include modified silicones, such as fluorosilicones.

The decoupling layers of the first and second barrier stacks can be the same, or they can be different. In addition, the decoupling layers within each barrier stack can be the same or different.

One or more of the decoupling layers can be pigmented or substantially opaque, if desired. This may be useful to produce colored backgrounds in displays for some applications.

The method of making the encapsulated display device will be described with reference to the embodiment shown in FIG. 3. Any initial functional layers which are desired, such as scratch resistant layers, planarizing layers, electrically conductive layers, etc., can be coated, deposited, or otherwise placed on the substrate. Alternatively, the substrate may be purchased with the functional layers already on it. A planarizing layer may be included to provide a smooth base for the remaining layers. It can be formed by depositing a layer of material such as a polymer, for example, a (meth)acrylate-containing polymer, onto the substrate or previous layer. The planarizing layer can be deposited in vacuum, by using atmospheric processes such as spin coating and/or spraying, or by roll coating. Preferably, an (meth)acrylate-containing polymer precursor is deposited and then polymerized in situ to form the polymer layer. As used herein, the term (meth)acrylate-containing polymer precursor includes acrylate-containing polymer precursors, methacrylate-containing polymer precursors, and combinations thereof. Polymer precursors include any material which will polymerize to form a polymer, including monomers, oligomers, and resins.

The second barrier stack is then placed on the substrate. The first and second barrier stacks include at least one barrier layer and at least one polymer layer. The barrier stacks may be placed on the substrate (or other previous layer) by processes including, but not limited to, depositing them or laminating them. The barrier stacks may be completely deposited under vacuum, or partially deposited under vacuum and partially at atmospheric pressure.

Vacuum deposition of the decoupling layers includes, but is not limited to, flash evaporation of polymer precursors with in situ polymerization under vacuum, and plasma deposition and polymerization of polymer precursors. Atmospheric processes for depositing the decoupling layers include, but are not limited to, spin coating and spraying. Vacuum deposition of the barrier layers includes, but is not limited to, sputtering, evaporation, sublimation, chemical vapor deposition (CVD), plasma enhanced chemical vapor deposition (PECVD), electron cyclotron resonance-plasma enhanced chemical vapor deposition (ECR-PECVD), and combinations thereof. U.S. Pat. Nos. 5,440,446 and 5,725,909, which have been incorporated by reference, describe methods of depositing thin film barrier layers and polymer layers.

Alternatively, the barrier stack may be placed adjacent to the substrate, organic light emitting device, or other layer by laminating it adjacent to the previous layer. The barrier stack may be preformed on a temporary or permanent substrate and then laminated adjacent to the previous layer. The lamination can be performed by processes including, but not limited to, heating, soldering, ultrasonic welding, applying pressure, or using an adhesive.

The environmentally sensitive display device is then placed on the second barrier layer, substrate, or other previous layer. The environmentally sensitive display device can be placed adjacent to the previous layer by deposition, such as vacuum deposition. Alternatively, it can be preformed and then placed adjacent to the previous layer by lamination. Methods of lamination include, but are not limited to, heating, soldering, ultrasonic welding, applying pressure, or using an adhesive.

The first barrier stack is then placed adjacent to the environmentally sensitive display device to encapsulate it. The first barrier stack can be placed adjacent to the environmentally sensitive display device by methods including, but not limited to, deposition and lamination, as described above.

An optional functional layer can be placed adjacent to the first barrier stack on the side opposite the organic light emitting device. An optional protective layer can be placed adjacent to the optional functional layer or the first barrier stack on the side opposite the organic light emitting device. The protective layer can be any of the commonly used protective layers, including, but not limited to metal cans, glass substrates, and epoxy or other sealants.

Avoiding the formation of defects and/or microcracks in the barrier layer helps to protect the integrity of the barrier layer. Therefore, it is desirable that the barrier layers are not directly contacted by any equipment, such as rollers in a web coating system, to avoid defects that may be caused by abrasion over a roll or roller. This can be accomplished by designing the deposition system so that the barrier layer is covered by a decoupling layer prior to contacting or touching any handling equipment.

A single pass, roll-to-roll, vacuum deposition of a three layer combination on a PET substrate, i.e., PET substrate/ polymer layer/barrier layer/polymer layer, can be more than five orders of magnitude less permeable to oxygen and water vapor than a single oxide layer on PET alone. See J. D. Affinito, M. E. Gross, C. A. Coronado, G. L. Graff, E. N. Greenwell, and P. M. Martin, *Polymer-Oxide Transparent Barrier Layers Produced Using PML Process*, 39$^{th}$ Annual Technical Conference Proceedings of the Society of Vacuum Coaters, Vacuum Web Coating Session, 1996, pages 392–397; J. D. Affinito, S. Eufinger, M. E. Gross, G. L. Graff, and P. M. Martin, *PML/Oxide/PML Barrier Layer Performance Differences Arising From Use of UV or Electron Beam Polymerization of the PML Layers*, Thin Solid Films, Vol. 308, 1997, pages 19–25. This is despite the fact that the effect on the permeation rate of the decoupling layers alone, without the barrier layer (oxide, metal, nitride, oxynitride), is barely measurable. This improvement in barrier properties is believed to be due to two factors. First, permeation rates in the roll-to-roll coated oxide-only layers were found to be conductance limited by defects in the oxide layer that arose during deposition and when the coated substrate was wound up over system idlers/rollers. Asperities (high points) in the underlying substrate are replicated in the deposited inorganic barrier layer. These features are subject to mechanical damage during web handling/take-up, and can lead to the formation of defects in the deposited film. These defects seriously limit the ultimate barrier performance of the films. In a single pass, decoupling layer/barrier layer/decoupling layer process, the first decoupling layer planarizes the substrate and provides an ideal surface for subsequent deposition of the inorganic barrier thin film. The second decoupling layer provides a robust "protective" film that minimizes damage to the barrier layer and also planarizes the structure for subsequent barrier layer (or organic light emitting layer stack) deposition. The decoupling layers also decouple defects that exist in adjacent barrier layers, thus creating a tortuous path for gas diffusion.

The permeability of the barrier stacks used in the present invention is shown in Table 1. The barrier stacks of the present invention on polymeric substrates, such as PET, have measured oxygen transmission rate (OTR) and water vapor transmission rate (WVTR) values well below the detection limits of current industrial instrumentation used for permeation measurements (Mocon OxTran 2/20L and Permatran). Table 1 shows the OTR and WVTR values (measured according to ASTM F 1927-98 and ASTM F 1249-90, respectively) measured at Mocon (Minneapolis, Minn.) for several barrier stacks on PET and polynorbornene (PNB), along with some other measured values.

TABLE 1

| Sample | Oxygen Permeation Rate (cc/m$^2$/day) | | Water Vapor Permeation (g/m$^2$/day)[+] | |
|---|---|---|---|---|
| | 23° C. | 38° C. | 23° C. | 38° C. |
| Native 7 mil PET | 7.62 | — | — | — |
| TransphanJ[1] | >1000 | | | |
| Native PNB[1] | >1000 | | | |
| 2-barrier stacks on PNB | 1 | | | |
| 1-barrier stack | <0.005 | <0.005* | — | 0.46[+] |
| 1-barrier stack with ITO | <0.005 | <0.005* | — | 0.011[+] |
| 2-barrier stacks | <0.005 | <0.005* | — | <0.005[+] |
| 2-barrier stacks with ITO | <0.005 | <0.005* | — | <0.005[+] |
| 5-barrier stacks | <0.005 | <0.005* | — | <0.005[+] |
| 5-barrier stacks with ITO | <0.005 | <0.005* | — | <0.005[+] |

*38° C., 90% RH, 100% O$_2$
[+]38° C., 100% RH
[1]Measured according to ASTM F 1927-98.
NOTE: Permeation rates of <0.005 are below the detection limits of current instrumentation (Mocon OxTran 2/20L).

As can be seen from the data in Table 1, the barrier stacks used in the present invention provide exceptional environmental protection, which was previously unavailable with polymers. The barrier stacks of the present invention provide oxygen and water vapor permeation rates several orders of magnitude better than PET alone. Typical permeation rates for other barrier coatings range from 0.1 to 1 cc/m$^2$/day. The barrier stacks are extremely effective in preventing oxygen and water penetration to the underlying devices, and substantially outperform other barrier coatings on the market.

Two barrier stacks were applied to the polynorbornene. At a temperature of 23° C., the two barrier stacks reduced the oxygen permeation rate from >1000 cc/m$^2$/day to 1 cc/m$^2$/day, an improvement of more than three orders of magnitude. The polynorbornene used in the preliminary evaluation was a prototype material and had very poor surface quality (pits, scratches, and other surface defects). It is believed that the oxygen and water vapor permeation rates can be reduced to <0.005 cc/m$^2$/day by using a better quality substrate material and more barrier stacks.

We have also compared the performance of OLED devices (fabricated on glass and silicon) before and after encapsulation using the barrier stacks of the present invention. After encapsulation, the current density-versus-voltage and brightness-versus-current density characteristics were identical (within experimental error) to the measured behavior of the pristine (unencapsulated) devices. This shows that the barrier stacks and deposition methods are compatible with OLED device manufacturing.

Using a process of flash evaporation of a polymer precursor and magnetron sputtering to deposit the barrier stacks, deposition temperatures are well below 100° C., and stresses in the barrier stack can be minimized. Multilayer barrier stacks can be deposited at high deposition rates. No harsh gases or chemicals are used, and the process can be scaled up to large substrates and wide webs. The barrier properties of the barrier stack can be tailored to the application by controlling the number of layers, the materials, and the layer design. In addition, because the barrier stacks include crosslinked decoupling layers and hard barrier layers, the barrier stacks provide a degree of chemical resistance and scratch resistance.

Thus, the present invention provides a barrier stack with the exceptional barrier properties necessary for hermetic sealing of an OLED. It permits the production of an encapsulated OLED.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. An encapsulated organic light emitting device comprising:

a substrate;

an organic light emitting device adjacent to the substrate; and at least one first barrier stack adjacent to the organic light emitting device, the at least one first barrier stack comprising at least one first barrier layer and at least one first decoupling layer, wherein the at least one first barrier stack encapsulates the organic light emitting device.

2. The encapsulated organic light emitting device of claim 1 further comprising at least one second barrier stack adjacent to the substrate and located between the substrate and the organic light emitting device, the at least one second barrier stack comprising at least one second barrier layer and at least one second decoupling layer, wherein the at least one first and second barrier stacks encapsulate the organic light emitting device.

3. The encapsulated organic light emitting device of claim 1 wherein the at least one first barrier stack is substantially transparent.

4. The encapsulated organic light emitting device of claim 2 wherein the at least one second barrier stack is substantially transparent.

5. The encapsulated organic light emitting device of claim 1 wherein at least one of the at least one first barrier layers comprises a material selected from metals, metal oxides, metal nitrides, metal carbides, metal oxynitrides, metal oxyborides, or combinations thereof.

6. The encapsulated organic light emitting device of claim 5 wherein at least one of the at least one first barrier layers is metal selected from aluminum, titanium, indium, tin, tantalum, zirconium, niobium, hafnium, yttrium, nickel, tungsten, chromium, zinc, alloys thereof, or combinations thereof.

7. The encapsulated organic light emitting device of claim 5 wherein at least one of the at least one first barrier layers is metal oxide selected from silicon oxide, aluminum oxide, titanium oxide, indium oxide, tin oxide, indium tin oxide, tantalum oxide, zirconium oxide, niobium oxide, hafnium oxide, yttrium oxide, nickel oxide, tungsten oxide, chromium oxide, zinc oxide, or combinations thereof.

8. The encapsulated organic light emitting device of claim 5 wherein at least one of the at least one first barrier layers is metal nitride selected from aluminum nitride, silicon nitride, boron nitride, germanium nitride, chromium nitride, nickel nitride, or combinations thereof.

9. The encapsulated organic light emitting device of claim 5 wherein at least one of the at least one first barrier layers is metal carbide selected from boron carbide, tungsten carbide, silicon carbide, or combinations thereof.

10. The encapsulated organic light emitting device of claim 5 wherein at least one of the at least one first barrier layers is metal oxynitride selected from aluminum oxynitride, silicon oxynitride, boron oxynitride, or combinations thereof.

11. The encapsulated organic light emitting device of claim 5 wherein at least one of the at least one first barrier layers is metal oxyboride selected from zirconium oxyboride, titanium oxyboride, or combinations thereof.

12. The encapsulated organic light emitting device of claim 1 wherein the at least one first barrier stack is substantially opaque.

13. The encapsulated organic light emitting device of claim 2 wherein the at least one second barrier stack is substantially opaque.

14. The encapsulated organic light emitting device of claim 1 wherein at least one of the at least one first barrier layers comprises an opaque cermet selected from zirconium nitride, titanium nitride, hafnium nitride, tantalum nitride, niobium nitride, tungsten disilicide, titanium diboride, zirconium diboride, or combinations thereof.

15. The encapsulated organic light emitting device of claim 1 wherein the substrate comprises a flexible glass.

16. The encapsulated organic light emitting device of claim 1 wherein the substrate comprises a rigid substrate material is selected from ceramics, polymers, semiconductors, glass, silicon, or combinations thereof.

17. The encapsulated organic light emitting device of claim 1 wherein at least one of the at least one first decoupling layers is selected from organic polymers, inorganic polymers, organometallic polymers, hybrid organic/inorganic polymer systems, and silicates.

18. The encapsulated organic light emitting device of claim 17 wherein at least one of the at least one first decoupling layers is organic polymer selected from urethanes, polyamides, polyimides, polybutylenes, isobutylene isoprene, polyolefins, epoxies, parylene, benzocyclobutadiene, polynorbornenes, polyarylethers, polycarbonate, alkyds, polyaniline, ethylene vinyl acetate, and ethylene acrylic acid.

19. The encapsulated organic light emitting device of claim 17 wherein at least one of the at least one first decoupling layers is inorganic polymer selected from silicones, polyphosphazenes, polysilazane, polycarbosilane, polycarborane, carborane siloxanes, polysilanes, phosphonitirles, sulfur nitride polmers and siloxanes.

20. The encapsulated organic light emitting device of claim 17 wherein at least one of the at least one first decoupling layers is organometallic polymer selected from organometallic polymers of main group metals, transition metals, and lanthanide/actinide metals.

21. The encapsulated organic light emitting device of claim 17 wherein at least one of the at least one first decoupling layers is hybrid organic/inorganic polymer system selected from organically modified silicates, preceramic polymers, polyimide-silica hybrids, (meth)acrylate-silica hybrids, polydimethylsiloxane-silica hybrids and ceramers.

22. The encapsulated organic light emitting device of claim 1 further comprising at least one functional layer adjacent to the substrate and located between the substrate and the organic light emitting device.

23. The encapsulated organic light emitting device of claim 22 wherein at least one of the at least one functional layers is selected from planarizing layers, scratch resistant layers, anti-reflective coatings, anti-fingerprint coatings, anti-static coatings, electrically conductive layers, color filters, uv protection layers, anticorrosion layers, flame retardant coatings, adhesive layers, or combinations thereof.

24. The encapsulated organic light emitting device of claim 1 wherein the oxygen transmission rate through the at least one first barrier stack is less than 0.005 cc/m$^2$/day at 23° C. and 0% relative humidity.

25. The encapsulated organic light emitting device of claim 1 wherein the oxygen transmission rate through the at least one first barrier stack is less than 0.005 cc/m$^2$/day at 38° C. and 90% relative humidity.

26. The encapsulated organic light emitting device of claim 1 wherein the water vapor transmission rate through the at least one first barrier stack is less than 0.005 gm/m$^2$/day at 38° C. and 100% relative humidity.

27. The encapsulated organic light emitting device of claim 1 further comprising a functional layer adjacent to the at least one first barrier stack on a side opposite the organic light emitting device.

28. The encapsulated organic light emitting device of claim 1 further comprising a protective layer adjacent to the at least one first barrier stack on a side opposite the organic light emitting device.

29. An encapsulated organic light emitting device comprising:
   at least one second barrier stack comprising at least one second barrier layer and at least one second decoupling layer;
   an organic light emitting device adjacent to the at least one second barrier stack; and
   at least one first barrier stack adjacent to the organic light emitting device, the at least one first barrier stack comprising at least one first barrier layer and at least one first decoupling layer, wherein the at least one first barrier stack and the at least one second barrier stack encapsulate the organic light emitting device.

30. The encapsulated organic light emitting device of claim 29 further comprising a substrate adjacent to the at least one second barrier stack on a side opposite the organic light emitting device.

31. The encapsulated organic light emitting device of claim 29 wherein at least one of the at least one first or second barrier layers comprises a material selected from metals, metal oxides, metal nitrides, metal carbides, metal oxynitrides, metal oxyborides, or combinations thereof.

32. The encapsulated organic light emitting device of claim 31 wherein at least one of the at least one first or second barrier layers is metal selected from aluminum, titanium, indium, tin, tantalum, zirconium, niobium, hafnium, yttrium, nickel, tungsten, chromium, zinc, alloys thereof, or combinations thereof.

33. The encapsulated organic light emitting device of claim 31 wherein at least one of the at least one first or second barrier layers is metal oxide selected from silicon oxide, aluminum oxide, titanium oxide, indium oxide, tin oxide, indium tin oxide, tantalum oxide, zirconium oxide, niobium oxide, hafnium oxide, yttrium oxide, nickel oxide, tungsten oxide, chromium oxide, zinc oxide, or combinations thereof.

34. The encapsulated organic light emitting device of claim 31 wherein at least one of the at least one first or second barrier layers is metal nitride selected from aluminum nitride, silicon nitride, boron nitride, germanium nitride, chromium nitride, nickel nitride, or combinations thereof.

35. The encapsulated organic light emitting device of claim 31 wherein at least one of the at least one first or second barrier layers is metal carbide selected from boron carbide, tungsten carbide, silicon carbide, or combinations thereof.

36. The encapsulated organic light emitting device of claim 31 wherein at least one of the at least one first or second barrier layers is metal oxynitride selected from aluminum oxynitride, silicon oxynitride, boron oxynitride, or combinations thereof.

37. The encapsulated organic light emitting device of claim 31 wherein at least one of the at least one first or second barrier layers is metal oxyboride selected from zirconium oxyboride, titanium oxyboride, or combinations thereof.

38. The encapsulated organic light emitting device of claim 29 wherein at least one of the at least one first or second barrier layers comprises opaque cermet selected from zirconium nitride, titanium nitride, hafnium nitride, tantalum nitride, niobium nitride, tungsten disilicide, titanium diboride, zirconium diboride, or combinations thereof.

39. The encapsulated organic light emitting device of claim 29 wherein at least one of the at least one first or second decoupling layers is selected from organic polymers, inorganic polymers, organometallic polymers, hybrid organic/inorganic polymer systems, and silicates.

40. The encapsulated organic light emitting device of claim 29 wherein the oxygen transmission rate through the at least one first barrier stack is less than 0.005 cc/m$^2$/day at 23° C. and 0% relative humidity.

41. The encapsulated organic light emitting device of claim 29 wherein the oxygen transmission rate through the at least one first barrier stack is less than 0.005 cc/m$^2$/day at 38° C. and 90% relative humidity.

42. The encapsulated organic light emitting device of claim 29 wherein the water vapor transmission rate through the at least one first barrier stack is less than 0.005 gm/m$^2$/day at 38° C. and 100% relative humidity.

43. The encapsulate organic light emitting device of claim 29 further comprising at least one functional layer adjacent to the at least one first barrier stack on a side opposite the organic light emitting device.

44. The encapsulated organic light emitting device of claim 29 further comprising a protective layer adjacent to the at least one first barrier stack on a side opposite the organic light emitting device.

* * * * *

UNITED STATES PATENT AND TRADEMARK OFFICE
CERTIFICATE OF CORRECTION

PATENT NO.     : 6,570,325 B2
DATED          : May 27, 2003
INVENTOR(S)    : Graff et al.

It is certified that error appears in the above-identified patent and that said Letters Patent is hereby corrected as shown below:

<u>Title page,</u>
Item [75], Inventors: "Ming-Kun Shi, Richland, WA (US);" should be -- Ming-Kun Shi, Castro Valley, CA (US); --.

Signed and Sealed this

Thirtieth Day of September, 2003

JAMES E. ROGAN
*Director of the United States Patent and Trademark Office*